(12) United States Patent
Freking et al.

(10) Patent No.: US 6,304,197 B1
(45) Date of Patent: Oct. 16, 2001

(54) CONCURRENT METHOD FOR PARALLEL HUFFMAN COMPRESSION CODING AND OTHER VARIABLE LENGTH ENCODING AND DECODING

(76) Inventors: Robert Allen Freking, 2258 Timberlea Dr., Woodbury, MN (US) 55125-3001; Keshab K. Parhi, 27492 Avanti Dr., Mission Viejo, CA (US) 92692

(*) Notice: Subject to any disclaimer, the term of this patent is extended or adjusted under 35 U.S.C. 154(b) by 0 days.

(21) Appl. No.: 09/524,834

(22) Filed: Mar. 14, 2000

(51) Int. Cl.$^7$ ................................................ H03M 7/00
(52) U.S. Cl. ............................................................ 341/65
(58) Field of Search ................................ 341/65, 67, 51

(56) References Cited

U.S. PATENT DOCUMENTS

| | | | |
|---|---|---|---|
| 6,043,765 | 3/2000 | Twardowski | 341/65 |
| 6,130,630 | 10/2000 | Grohs | 341/65 |

*Primary Examiner*—Brian Young (57) ABSTRACT

A method of processing multiple VLC data elements concurrently. A system realizing this method comprises a plurality of encoders under control and a plurality, typically like in number, of decoders under separate, but accorded control. Furthermore, a means of communication from the former to the latter is incorporated in which ordinal and temporal correspondence is established between particular encoders and particular decoders. Encoder control provides an ordered symbol assignment strategy across all encoders. Decoder control detects the encoder assignment strategy and applies it to the task of restoring the original output order among all decoder outputs.

19 Claims, 4 Drawing Sheets

CONCURRENT METHOD FOR PARALLEL HUFFMAN COMPRESSION CODING AND OTHER VARIABLE LENGTH ENCODING AND DECODING

CROSS-REFERENCE TO RELATED APPLICATIONS

Not applicable.

BACKGROUND OF THE INVENTION

1. Field of the Invention

The present invention relates to the processing of digital signals to effect variable-length coding (VLC) wherein execution transpires over multiple data concurrently.

2. Description of Related Art

Much of the putative parallel-processing art in VLC and its subclasses, such as Huffman coding, is labeled as such despite lacking the ability to process multiple VLC data units simultaneously. Instead, acting on just one unit at a time, a result is produced in an accelerated course by examining several limited aspects of the problem at once. True parallel processing is rare in the art as a result of a fundamental incongruity between VLC and parallelism.

The digital signal processing technique, VLC, entails the translation of multiple-bit units of data between fixed-length and variable-length representations, often for the purpose of achieving an aggregate reduction in data in the variable-length domain. The fixed-length units, termed symbols, conveniently partition unencoded data. A symbol's unique variable-length encoded counterpart, the codeword, serves the role of an intermediary, facilitating storage and/or data transmission until it may be decoded back into a usable symbol. In canonical form, a VLC system comprises an encoder, a decoder and an intervening channel providing unidirectional communication of coded data from the encoder to the decoder. An encoder generates a contiguous stream of codewords of uneven extents in ordered correspondence with the input symbol stream, while a decoder reverses this process.

In VLC, length is either an embedded or an implicitly associated attribute of each codeword. Therefore, apart from knowledge internalized with each codeword, the coded stream has no discernible demarcation between codewords. Only by accounting for the span of all codewords succeeding a known reference can a subsequent codeword boundary be deduced. Hence, a serial dependency is established on the process of resolving codewords within a contiguous stream.

As a general principle, parallel processing requires a method of separating data into independent elements for distribution among multiple processing elements (PEs). Inasmuch as the data fail to be independent, processing will be subject to serial dependencies. In VLC, irregular stream delimitation precludes a means of selecting independent data prior to ascertaining the extent of each preceding codeword. Unfortunately, determining codeword lengths is tantamount to decoding if length information is implicit and nearly so if it is embedded. As a result of this dilemma, fully concurrent processing has not heretofore been achieved in a VLC context.

The article, H. D. Lin and D. G. Messerschmitt, "Designing a High-Throughput VLC Decoder Part II", IEEE Transactions on Circuits and Systems for Video Technology, pp. 197–206, 1992, proposes forcing codeword alignment at fixed intervals. In effect, the codeword stream is divided into equal-sized multiple-codeword blocks in which the first codeword of each block is justified with the block boundary. Rather than processing individual codewords in parallel, the larger blocks are distributed among PEs. Where the final codeword would otherwise extend beyond the block boundary, it is simply detained, becoming the first codeword of the subsequent block. As a result of this practice, voids of varying length are introduced at the end of a majority of the blocks. These lacunae in the coded transmission clearly contravene the purposes of the principal motivation for VLC, data compression. If blocks are made longer to amortize this compressive inefficiency, more buffering memory is needed. In general, a prohibitive quantity of memory is required to store the large blocks central to this scheme. Moreover, as a result of this buffering, a long latency is incurred between the arrival of input and the emission of output.

In the same article, a variation on the foregoing method is discussed in which several multiple-codeword blocks are again distributed among as many PEs. However, no attempt is made to align codewords with block boundaries. Instead, each block is examined over many ramifications resulting from all possible codeword initiation sites within the block. Problem growth is typically substantial since the lengthiest codeword dictates the number of potential codeword origination points. The correct decoding among all alternatives is identified upon receipt of the terminal location within the previous block. Hence, serial dependence between codewords, while not completely eliminated has been deferred to the final steps. Although no compression-rate overhead is suffered by this second approach, as the consequence of the trial processing of so many ramifications, memory requirements are many multiples of the preceding memory-intensive approach. Furthermore, all but one of the ramified processing courses undertaken for each block is discarded, resulting in exorbitant computational waste. Within each concurrent block either each course is simultaneously computed through a more deeply nested level of concurrency, thus multiplying hardware excessively, or each course is dealt with in turn slowing computation proportionally. In the latter circumstance, an exceptionally high parallelism factor exceeding the longest codeword length is necessary to derive any performance benefit at all from the approach.

In U.S. Pat. No. 5,841,380 a similarly ramified approach to neutralizing serial dependency is suggested, but on the scale of individual codewords rather than blocks. In that exemplar, two codewords are decoded in tandem, with the first processed in the normal fashion and the second, whose locality within the stream is yet unidentified, processed from all potential initiation sites in parallel. Upon the conclusion of decoding, the correct result for the second codeword is isolated from among the many provisional decodings in accordance with the discovered length of the first codeword. Although the approach might have been extended to more than two codewords, as was suggested in the previously described block-based method, the restriction to just two codewords in the case cited is in keeping with the undeniably impractical growth in complexity attending such ramified methodologies.

U.S. Pat. No. 5,202,967 attempts to circumvent ramifications by placing format restrictions on every other codeword such that, in a two-processor system, the second processor can identify and thus decode the second codeword without reference to the first. This special format violates the basic principles of VLC, however.

Also in the aforementioned article, as well as in the article, K. K. Parhi, "High-Speed VLSI Architectures for Huffman and Viterbi Decoders," IEEE Transactions on Circuits and Systems II, vol. 39, no. 6, 1992, the decoding problem is recast in a circuit-dependency framework known as the finite state machine (FSM). Exploiting known parallelizing transformations on FSMs, the computation can be expanded over duplicate nodes, producing a concurrent process. Since codewords are involved directly in the formulation of the FSM, the resultant hardware is not programmable. Thus, the FSM design process must be repeated and new hardware fabricated for each new code. As intimated in the former citation and admitted in the latter, the approach is chiefly of academic interest since it is only applicable for symbols drawn from artificially diminutive sets. Furthermore, as demonstrated in the latter article, the manipulations required to arrive at the final result, and accordingly the final result itself, are quite complicated.

In the article, P. G. Howard and J. S. Vitter, "Parallel Lossless Image Compression Using Huffman and Arithmetic Coding," in Proceedings of the Data Compression Conference, pp. 229–308, Snowbird, Utah, March, 1992, block processing is again suggested. In this case, each codeword in a block is disassembled bit by bit, commencing with the first bit and proceeding to the last. All the first bits are juxtaposed, followed by all the second bits and so on. These are distributed among multiple decoding PEs according to the state of decoding. Short codewords are decoded before longer codewords. PEs processing such codewords can signal their completion, avoiding the receipt of latter bits. If the number of PEs is less than the number of codewords found within a block several codewords may be allocated to each PE. Those PEs that decode an allotment of short codewords may obtain codewords from PEs with a backlog, thereby distributing the computing load. Toward the end the block, it is expected that the number of unclaimed codewords will be insufficient to keep all PEs occupied. Thus, provision is made for idle PEs to be disabled. Unfortunately, workload distribution and PE disablement are not trivially implemented tasks. Worse, workload distribution introduces serial dependency, which interrupts parallelism. As well, PE disablement merely extenuates, but does not eliminate wasted computation cycles. A further significant difficulty with this technique is its reliance on parallel random-access memory (PRAM), a bulky and complex arrangement which severely impairs parallel operations in practice. Besides a reduction in performance, the use of PRAM enforces undesirable limits on parallel scalability, i.e., the factor by which PEs may be multiplied.

U.S. Pat. No. 5,623,262 offers a scheme for decoding multiple codewords simultaneously without concurrent hardware. This involves recasting the mapping between symbols and codewords. Specifically, multiple-symbol amalgams are associated with multiple-codeword amalgams constituted in original correspondence with the individual symbols of the symbol amalgam. Consequently, a codeword amalgam instantly decodes to as many symbols as are encoded therein. The drawback of this method is clear; for practical benefit the recast mapping must be made dramatically larger than the original. Furthermore, the quantity of symbols recovered at each step varies.

Beyond the preceding approaches, two prevalent variations on parallelism in the art are found. The first, as broached previously, involves the bringing several operations to bear on a single codeword simultaneously to speed the production of the result. This style of processing is represented in U.S. Pat. Nos. 5,032,838, 5,757,295, and 5,798,719. Since these do not endeavor to process multiple codewords in unison, their ostensible parallelism is unrelated to the full inter-codeword parallelism of the present invention.

The second style of parallelism superficially appears more material, but is actually quite distinct. In those approaches, multiple independent symbol streams are transformed by as many encoders into distinct codeword streams. These may or may not be coalesced into a single stream during the interim between encoding and decoding. Regardless, by the time these streams are redistributed to their corresponding decoders they are once again separate independent codewords streams. Of course, multiple independent symbol streams are recovered at the decoders. The key to parallelism of this kind lies entirely in the independence of the streams. In fact, there is no novelty in the parallelism of the foregoing at all. Consider that there may be, at any one time, legion unrelated VLC systems around the globe processing undeniably independent data. The simple collocation of two or more such disparately purposed systems on the same silicon chip does not make them parallel in any more informative sense of the word than contained in the assertion that two workers performing different duties in the same office are working in parallel. This is not to say that methods incorporating this concept do not possess other novel attributes, though.

Most of the art relying on the independent-stream mode of parallelism is unique by virtue of the way separability and reassembly is obtained for data speciously held to be monolithic. For example in U.S. Pat. No. 5,379,070, JPEG images are sliced vertically into separate, independent data segments. To facilitate synchronization and reassembling, various fiducial data are interposed on these segments. These segments may then be VLC encoded, transmitted and decoded independently. An elaborate process of reconstruction, unrelated to VLC coding, then ensues. U.S. Pat. No. 5,568,139 focuses on image data as well. The invention is particularly premised on the feasibility of dividing raster images along transverse boundaries, each segment thereby consisting of a fixed quantity of image lines. These being distinct are manipulated in the independent-stream mode of parallelism after being distributed among multiple decoders. Because the method of separating image blocks is simple, so too is the reconstruction process. Another invention employing independent-stream-derived concurrency is found in U.S. Pat. No. 5,654,703 where the content of the data is not constrained, but the requirement of independence is maintained. The author calls upon the example of the separate color components, luminance, chrominance and saturation as three independent data sets for which the invention would be particularly well suited. The unique feature of this invention is found in an involuted manner of blending distinct encoded data into a unified stream and, accordingly, extracting these again into separate streams. In fact, this process suffers from contention which adversely impacts performance.

U.S. Pat. No. 5,808,752 demonstrates a very basic application of independent-stream parallelism for a two-sided image reading apparatus. In this case, data from the top side of a page constitutes one stream while data from the bottom forms the other. These are obviously independent data.

SUMMARY OF THE INVENTION

The present invention describes a means of processing multiple VLC data elements concurrently. A system realizing this means comprises a plurality of encoders under control and a plurality, typically like in number, of decoders under separate, but accorded control. Furthermore, a means of communication from the former to the latter is incorporated in which ordinal and temporal correspondence is established between particular encoders and particular decoders. Encoder control provides an ordered symbol assignment strategy across all encoders. Decoder control detects the encoder assignment strategy and applies it to the task of restoring the original output order among all decoder outputs. Storage, preferably local to each decoder, is provided in quantities sufficient to detain each symbol until all predecessors have been expelled onto the output.

OBJECTS AND ADVANTAGES OF THE INVENTION

A pronounced growth in the volume of existent digital information has been witnessed of late, spurred by a marked transition in the communications infrastructure from primarily analog technology to digital. The practice of data compression, as typified by VLC, provides an obvious countermeasure to this quantitative increase, effectively reducing the totality of transmitted and archived data. However, the appetite for data-intensive applications has outpaced the operational capabilities of this economizing process. Parallel processing has the potential to deliver significant performance boosts to such technology-bound procedures.

The overarching object of this invention is the reconciliation of parallelism with VLC in a manner that is general and effectual.

Parallelism, because it requires the advance partitioning of input into its constituent elements, is fundamentally in conflict with the properties of VLC codeword streams, which exhibits an unbroken succession of dependency between unpredictable codeword boundaries. In fact, the discovery of codeword delimitation is tantamount to a decoding operation, in which it is integral.

A paramount object and advantage of this invention is that it may operate upon a single, monolithic stream of data of generic content, i.e., data may arise from any source and need possess no independent components. Even so, boundary discovery is deferred to the final decoding stage, in the usual manner of serial decoding, as though each decoder dealt with independent data streams. N.B. A difficult demand for multiple independent streams permeates much of the art.

Another striking advantage of this invention is the quality of parallelism rendered thereby. This parallelism is optimally potent in that it may be guaranteed that, at any time, one symbol/codeword may be undergoing encoding/decoding for each encoder/decoder employed. Aggregate throughput is thus directly proportional to the parallelism factor.

Another related advantage is revealed in this invention's complete utilization of processing resources. Specifically, the invention has the capability to occupy all encoders and decoders with useful processing constantly, without interruption. Moreover, this is an intrinsic feature of normal embodiments of the invention, attained without deliberate manipulation.

Another related advantage resides in this invention's full utilization of communication resources. Waste of such resources by any mechanism, including the insertion of tags/markers or the interruption of a stream for any period, is antithetical to the goals of compression—the predominant employ of VLC. This invention does not introduce content or interruptions, thus devoting 100% of communication resources to actual data.

Another object and advantage is recognized in the format of the accepted input and generated output of this invention. Streamed input and output is a standard in communication and represents an ideal general model of more specialized formats encountered in other applications. Utilizing no block preprocessing or post-processing, the invention conforms to established standards without explicit manipulation.

A significant subsidiary advantage of the previous two is that the invention is transparent upstream from the encoders and downstream from the decoders. In particular, the invention appears indistinguishable from a conventional serial VLC system operating at a speed mimicking the parallel system's aggregate throughput.

Another unique advantage is secured by the minimal constraints levied upon the composing encoder and decoder PEs. Conveniently, any known serial encoder and decoder design may be chosen to serve as PEs so long as each exhibits fixed latency across all codeword lengths.

Fixed latency is nearly always assured for serial decoders. In fact, most serial encoders are of fixed latency, with those that are not being of questionable merit for duty even in serial systems.

Another advantage of this invention is apparent in the nature of the memory supporting it. Because only memory local to each processing path is involved, no performance robbing inter-parallel data transfers are demanded. Such undesirable structures as PRAM memory are not necessary.

Another noteworthy advantage is related to the complexity of the controlling means for both encoder and decoder. Such means are simple and minimal, consisting of common, accessible components. It follows, together with the previous two advantages, that an entire system built conforming to this invention is remarkably trivial in design.

A critical object and advantage related to several of the above advantages is the speed of processing offered by this invention. The effective throughput of such a system can facilely exceed the rates possible with serial systems. In fact, the effective rate climbs linearly with the parallelism factor based on the rate of a lone PE.

Another crucial object and advantage of this invention relates to the operating rate of the constituent encoder and decoder PEs. These are permitted to be clocked at a fraction of the rate of the throughput rate. That fraction is the inverse of the parallelism factor. This fact relaxes performance specifications impacting the design and construction of these elements, thus allowing even marginal hardware to serve effectively in high-performance systems. A leveraged advantage of the present invention is identified in its ability to provide online or off-line quality-of-service (QoS) regulation through the management of participating PEs. By selectively removing PEs from service or restoring them back to service various throughput rates could be achieved in accordance with the effective parallelism factor.

Another leveraged advantage of this invention is evident in its ability to effect low-power operation. One mechanism is apparent from the preceding QoS advantage; removal of a PE operation, if done suitably, will lead to a commensurate savings in power. Voltage-supply reduction provides another mechanism for power abatement, wherein the excess speed garnered by parallelism is sacrificed to this end.

Further objects and advantages of the invention will be apprehensible in the succeeding descriptions.

DETAILED DESCRIPTION OF PREFERRED EMBODIMENTS

1. Serial-Channel Embodiment 1.1 System Overview

Figure 1:
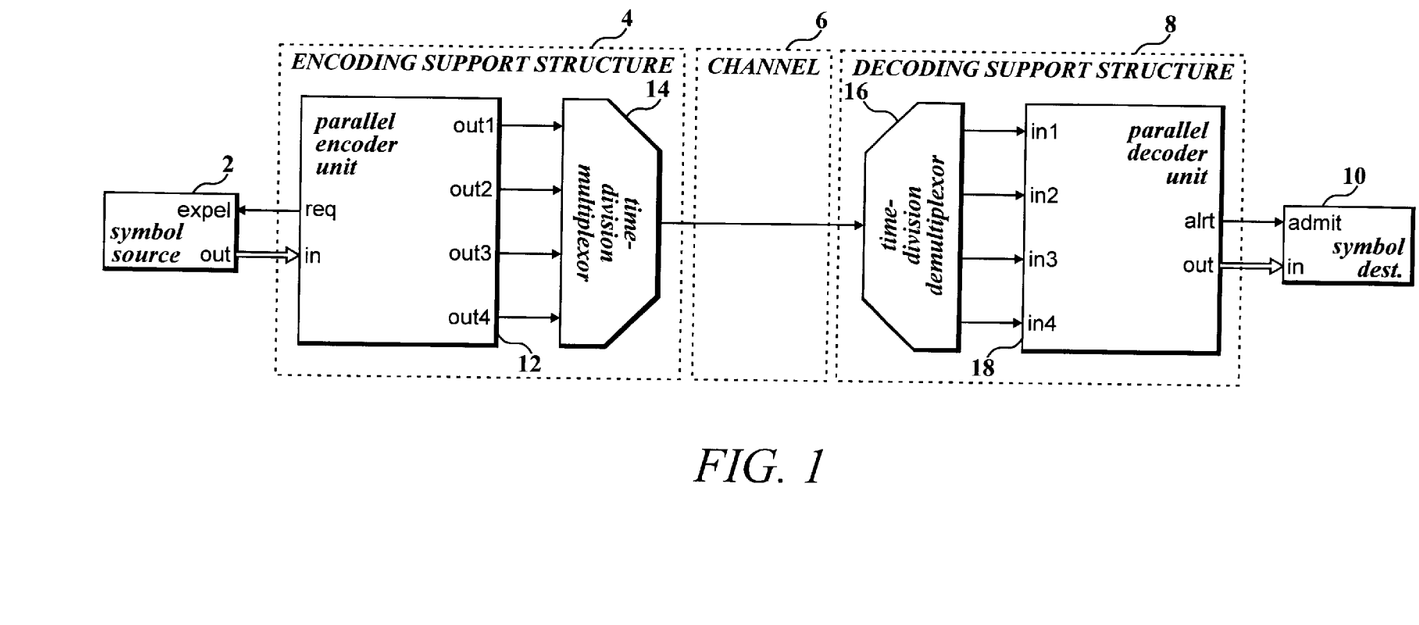
FIG. 1 shows a high-level view of the major components of complete serial-channel VLC system.

The preferred embodiment of this invention for a serial channel transmission is summarized in FIG. 1. Broadly, the invention comprises an encoding support section 4, a serial channel 6 a decoding support section 8. A symbol source 2 and a symbol destination 4 are artistic conceptions of external sources and sinks, encapsulating the key features of a typical interface enveloping any VLC system—parallel or not. Therefore, the symbol source 2 and symbol destination 4 are not parts of the invention, per se, but simply aid the exposition.

The preferred embodiment expounded herein is shown constructed with a parallelism factor of four, i.e., four parallel encoders and four parallel decoders are involved. Furthermore. a maximum codeword length of five will be evinced later in the discussion, where it applies. Let it be understood that this level of specificity is only shown only for demonstrative clarity. One of the salient advantages of this invention is the obviousness and effortlessness with which it may be scaled to other parallelism factors and other maximum codeword lengths. This disclaimer regarding specificity in the parameters mentioned will hereafter be deemed so immediately obvious to anyone having a basic grasp of the art that it will not be repeated.

Symbols are expelled from the OUT output of symbol source 2 every time a signal is raised on the EXPEL input. Similarly, the symbol destination 10 admits a symbol on the IN input every time a signal is raised on the ADMIT input.

The encoding support section 4 is further delineated as comprised of two units: a parallel encoder unit 12 and a time-division multiplexor 14. The decoding support is similarly shown as two units: a time-division demultiplexor 16 and a parallel decoder unit 18.

The parallel encoder unit 12 processes the input arriving on IN in a parallel manner to be described, generating one-bit outputs on OUT1, OUT2, OUT3, and OUT4 every cycle. These outputs represent particular bits of distinct codewords. They will henceforth be designated as codebits. Whenever a new symbol is required, this condition is flagged on the output REQ.

Codebits from the parallel encoder unit 12 are delivered directly to the time division multiplexor 14 which serializes them by juxtaposing them in order beginning with the topmost codebit and proceeding in regular succession to the bottom-most codebit. These are dispensed onto the channel 6 in the described order.

The time-division demultiplexor 16 reverses the process of the time-division multiplexor 14 by deserializing the codebits arriving from the channel 6 such that the first bit is placed on the topmost line and succeeding bits are place on progressively lower lines in corresponding fashion.

While the channel 6 serves the role of physically delivering serialized codebits from time-division multiplexor 14 to time-division multiplexor 16, it is appropriate to view time-division multiplexor 14, the serial channel 6 and the time-division demultiplexor 16 as composing a communication means which maintains ordinal and temporal correspondence. This is an exemplary, but not exclusive embodiment. Any communication means that maintains ordinal and temporal correspondence is acceptable. The procedure of time-division multiplexing was chosen for this embodiment only because it is direct and minimally complex for a serial-channel environment. Note that with this convenient choice, the correspondence is such that parallel decoder unit 18 receives on line IN1, IN2, IN3 and IN4 the codebit emitted on line OUT1, OUT2, OUT3, and OUTF4 of parallel encoder unit 12, respectively.

The parallel decoder unit 18, receiving codebits as enumerated above, processes these codebits in parallel in a manner yet to be described. When a decoded symbol is available to be output, the ALRT line is raised. Symbols are output on the line OUT in precisely the same order they in which they arrive at the input IN of the parallel encoder unit 12, thus completing the VLC operation.

1.2 Encoding Support Structure

Figure 2:
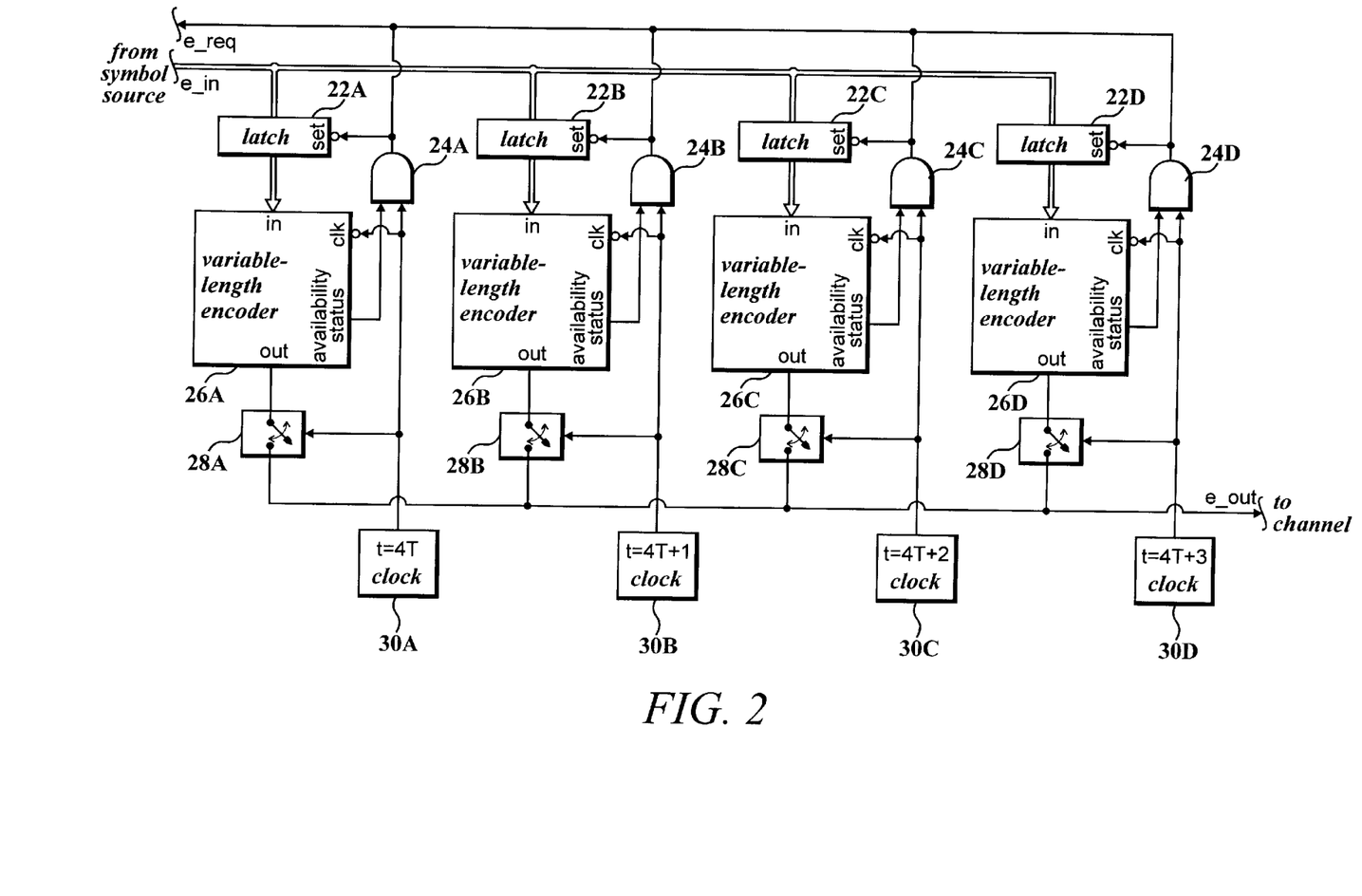
FIG. 2 depicts a parallel VLC encoding structure including controlling hardware. As well, the encoding section's portion of a serial-channel sharing means is shown.

The encoding support structure 4 is expanded in FIG. 2 to display the composing devices. For each path of parallel computation a latch 22, a variable-length encoder 26, an AND gate 24 and a clock 30 are provided. (Note that, to avoid repetition, the letter designator appending the numerals in the figure will be dropped when the discussion pertains equally to any one of the plurality of computation branches.) In the same figure, the time-division multiplexor 14-part of the communication means—is also expanded for each path of parallel computation paths as switch 28 under control of the same clock 30. The latch 22 is only required if the variable length encoder 26 does not have clocked edge-triggered latching incorporated internally in its design. Since this varies in practice, it will be assumed for the sake of example that the chosen encoder design realizing encoder 26 does not offer this feature.

The encoder 26 accepts multiple-bit symbols and produces one codebit per clock cycle, eventually expelling the entire associated codeword. Upon consummation of a codeword, the encoder 26 raises the line AVAILABILITY_STATUS to indicate readiness to accept a new symbol. The structure of encoder 26 will not be specified herein because it is one of the major advantages of this invention that any serial variable-length encoder with fixed-latency may be validly employed without modifications. Note that all serial variable-length encoders must provide a line of the sort identified here as AVAILABILITY_STATUS, since variable-length codewords associated with each symbol consume differing numbers of cycles in the output process. Often the line is labeled under a different alias, but recognition of its function is unmistakable. Certain encoder designs may incorporate their own buffering, causing that line to be regarded as internal. In this case that the variable-length encoder 26 represents only the encoding circuitry itself stripped, with any extra amenities stripped away.

Note that the variable-length encoder 26 operates P times slower than the incoming symbol source and the channel-bound output, where P is the parallelism factor—in this case four. Hence, a fast clock rate and a P-times-slower clock rate are entailed. Clocks 30A, 30B, 30C, and 30D, progressively skewed by one fast period in relation to each other, but repeating only on basis of the slower period, are provided to achieve this two-speed timing.

The special clock 30 regulates not only variable-length encoder 26, but the switch of the time-division multiplexor 14, as well. The composing switches 28A, 28B, 28C and 28D of the time-division multiplexor 14 are scanned in succession producing time-division multiplexing of the codebits emitted on the OUT lines of variable-length encoders 26A, 26B, 26C and 26C, respectively. These serialized codebit data are delivered on E_OUT where they interface with the channel 6.

The clock 6 indirectly controls the latch 22 through the AND gate 24, where it is logically intersected with the AVAILABILITY_STATUS line of the variable-length decoder 26. By this step, the latches 22A, 22B, 22C and 22D are also are scanned in the manner the switches 28A, 28B, 28C and 28D, but only when the availability condition permits.

Since the active condition of the outputs of and gates 24A, 24B, 24C, and 24D are mutually exclusive by virtue of the described clocking, they are combined in "wired-or" fashion to produce output signal E_REQ, with inactive drive on the line controlled accordingly. The "wired-or" is shown simply to avoid visual clutter in the diagram. The line E_REQ requests a new symbol from the symbol source 2.

1.2.1 Operational highlights of the encoding support structure

The effect of the availability masked scanning is such that it expresses an ordinal assignment strategy. In particular, an availability-based, prioritized (AP) strategy is thereby imposed. Priority is directly associated with ordinality, with each processing path granted the option of accepting the pending symbol ahead of those of subsequent ordinality. If the option is exercised, that symbol is extracted and the subsequent symbol becomes the pending symbol for succeeding processing paths. Otherwise, the same symbol remains pending for later paths.

1.3 Decoding Support Structure

Figure 3:
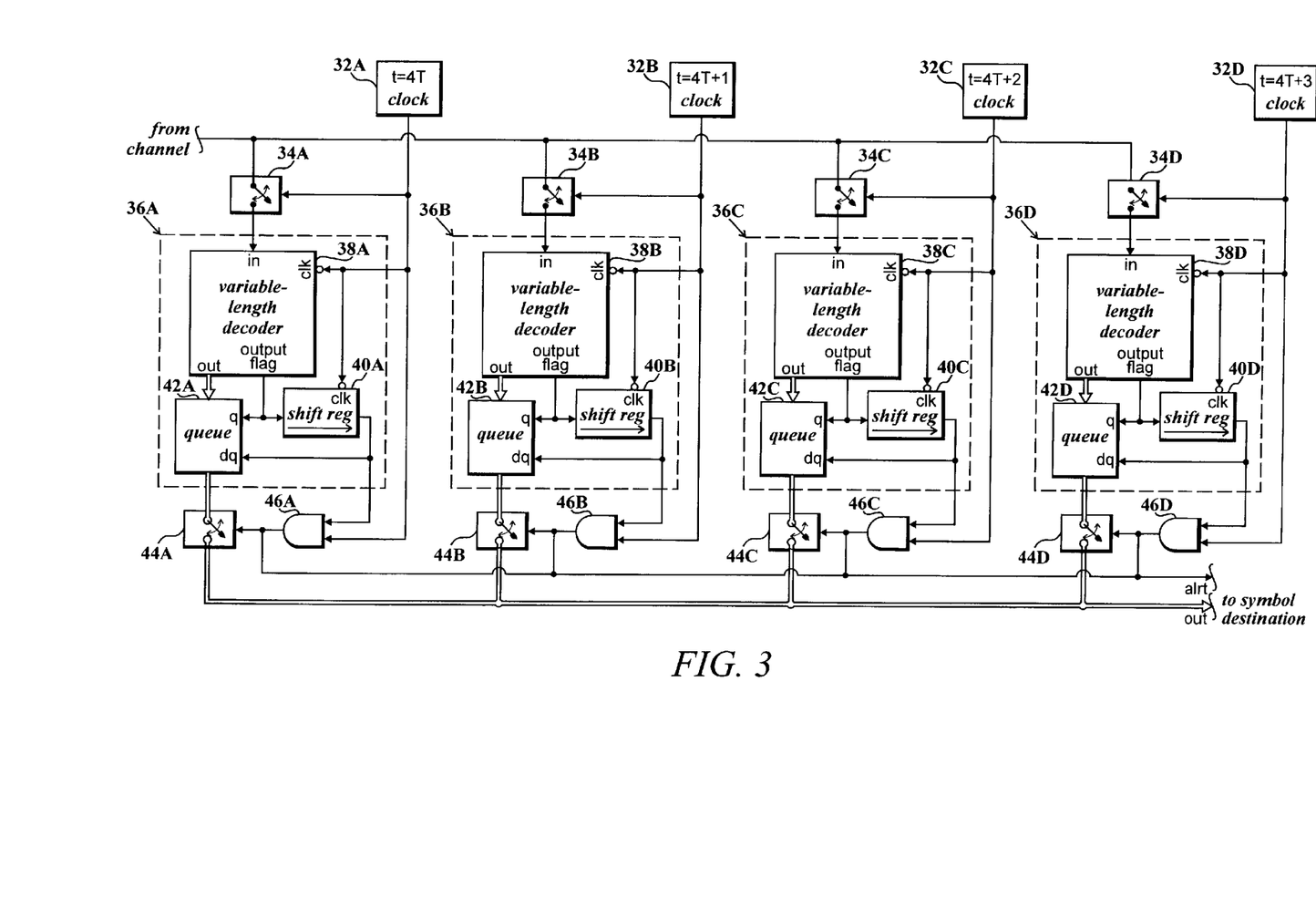
FIG. 3 diagrams a parallel VLC decoding structure including controlling hardware and supporting structures that aid in order recovery. The decoding section's portion of a serial-channel sharing means is also shown.

The decoding support structure 8 is elaborated in FIG. 3. The time-division demultiplexor 16 is implemented by latches 34A, 34B, 34C and 34D, which are scanned in respective succession by clocks 32A, 32B, 32C and 32D. Thereby the codebits arriving on line D_IN are distributed in perfect correspondence with the encoders discussed earlier. Again, as in section 1.2, the clocks 32A, 32B, 32C and 32D are skewed forward by one fast period in relation to neighboring predecessor clocks 32D, 32A, 32B and 32C, respectively. Yet, each repeats at the slow clock period: four times slower for this level of parallelism.

Each parallel-processing path is composed of a decoder cell 36 along with a switch 44 and an AND gate 46. The decoder cell 36 is further refined into a fixed-latency serial variable-length decoder 38 of any desired structure, a shift register 40 and a queue memory element 42. All serial variable-length decoders may be reasonably expected to extend a line such as OUTPUT_FLAG, which is raised when the decoder has completed decoding a codeword. The variable-length decoder 38 accepts one codebit per clock period on line IN and delivers one multiple-bit symbol on the line OUT after a clock cycles has elapsed for every bit in the codeword under processing. The clock 32, which beats at the slow clock period, directly synchronizes the operation of the variable-length decoder 38 and the shift register 40, while indirectly controlling the switch 44 through the AND gate 46, in conjunction with the output of the shift register 40.

As was the case in section 1.2, the latch 34 would be superfluous if it were assumed that the variable-length decoder provided edge-triggered latching. However, this will not be supposed here.

The shift register 40 serves to relay the OUTPUT_FLAG status of variable-length decoder 38 after the passage of a predetermined number of clock cycles. In particular, the shift register 40 is a long as the longest codeword, hence requiring as many cycles. However, the OUTPUT_FLAG of the variable-length decoder 38 functions equally well as an input notification since the arrival of a new codeword is coincident with the completion of the last.

Whereas the delay between the arrival of the first codebit on the IN line of variable-length decoder 38 and the generation of output on the OUT line varies with codeword length, the queue 42 provides a means of buffering which restores a constant delay to the operation. Specifically, the queue 42 delays decoded symbols by a number of clock cycles equal to the difference between the longest codeword length and the actual codeword length. This is trivially effected by linking the OUT_FLAG line of the variable-length decoder 38 with the queuing control, Q, and the output of the shift register 40 with the dequeing control, DQ.

The output of the shift registers 40A, 40B, 40C, and 40D which are clocked at the slow clock rate, indicate the readiness of symbol output in a scanned fashion, under the direction of clocks 32A, 32B, 32C and 32D, respectively. This indication closes switches 44A, 44B, 44C and 44D under the direction of AND gates 46A, 46B, 46C and 46D.

1.3. Operational highlights of the decoding support structure

Input scanning on latches 34A, 34B, 34C and 34D consummate the restoration of the parallel substreams manufactured by variable-length encoders 26A, 26B, 26C and 26D at the variable-length decoders 38A, 38B, 38C and 38D, respectively. The effect is as though there were a direct connection between variable-length encoder 26 and variable-length decoder 38.

The arrival of input is flagged in the shift register 40, thus delaying it for a given number of clock cycles. The delayed input-notification flag ensures that the queue 42 will release its next symbol at a time related directly to arrival. By scanning latches 44A, 44B, 44C and 44D in prioritized fashion, the AP scheme governing the input of the variable-length encoder 26 has been replicated in reversed functionality at the output of decoding support structure 8. This fact ensures that order of the original symbol stream is flawlessly recovered.

1.4 Queue

Figure 4:
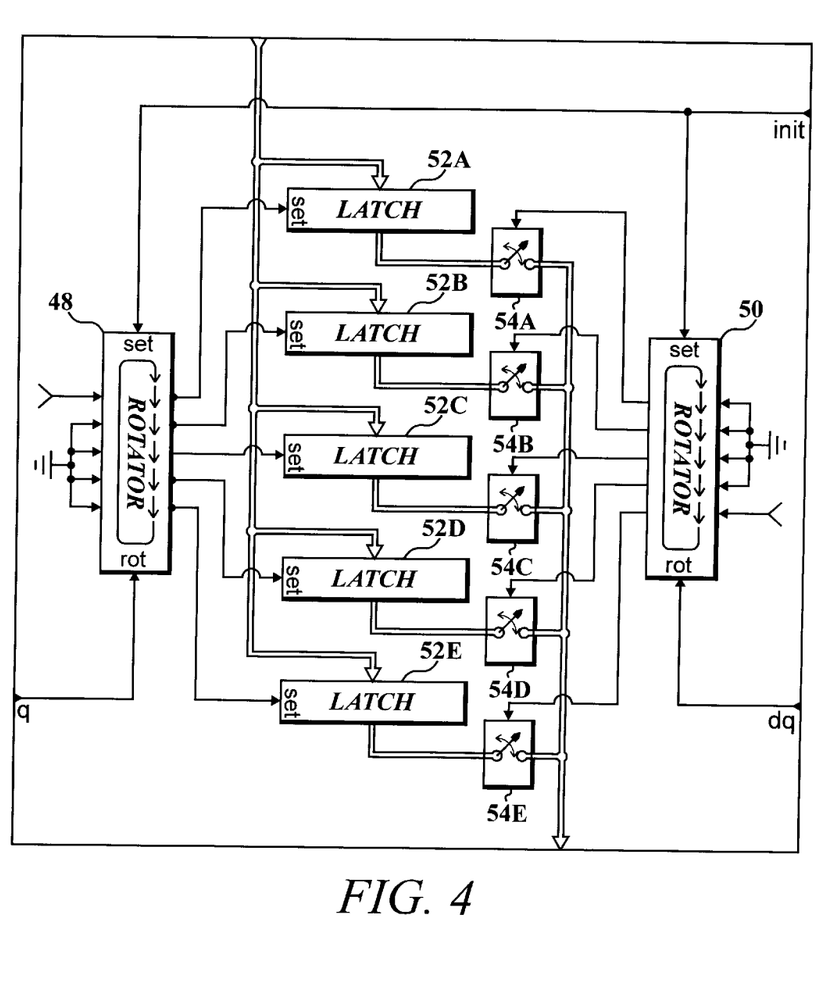
FIG. 4 illustrates a queue-type storage unit.

The queue 42 consists of one latch 52 and one switch 54 for each bit of codeword length in the longest codeword. Two rotator registers 48 and 50 corresponding to the queuing and dequeuing operations, respectively, are included. Each rotator admits one token, here indicated by the sole input line connected to the source, on the command in the input line Q_INIT which is only raised at the initiation of processing. Thereafter, the token circulates selecting only one latch 52 or switch 54. Note that the queuing rotator 48 and dequeuing rotator 50, by admitting initially offset tokens is able to establish the appropriate positional relationship between queued results and the next dequcuable. The queuing rotator 48 rotates one position upon the raising of Q_Q. The dequeuing rotator similarly rotates one position upon the raising of Q_DQ. result The selected latch 52 receives the multiple-bit symbol arriving of line Q_IN. The selected switch 54 connects the output line Q_OUT with the output of a specific latch 52.

1.4.1 Operational highlights of the queue

The queue 42, by circulating single tokens to successively select the next input latch 52 requires no arithmetical operations to implement addressing. Likewise by successively selecting the next output latch 52 via one switch 54, the same result is achieved. These rotators being independent are able to produce queue-type action provided that the external input Q_Q is never raised when the queue is full and the external input Q_DQ is never raised when the queue is empty. In the case of this invention, the external environment assures this condition. Such a queue is fast and minimally complex.

2. Parallel-Channel Embodiment

In this second embodiment it is assumed that the communication means providing ordinal and temporal correspondence is direct, i.e., each encoder PE is directly connected to each decoder PE. While not representative of a communications environment, which is almost always modeled by a serial channel, this direct means describes a computational software environment quite well. In particular, a computer typically handles data in fixed-length words. A parallelism factor of this length or multiples thereof would prove particularly advantageous.

A hardware embodiment of this invention in a parallel-channel environment could be effortlessly developed by connecting lines OUT1, OUT2, OUT3 and OUT4 of parallel encoder unit 12 directly to lines IN1, IN2, IN3 and IN4 of parallel decoder unit 18, respectively. The time-division multiplexor 14 and the time-division demultiplexor 16 would simply be deleted. However, a software embodiment demonstrates some unique considerations.

A single-instruction, multiple-data (SIMD) parallel-computer environment is chosen for this embodiment. Such a computer performs the same operation for every PE, but on different data, developing different results. Whereas in the first embodiment, two speed clocking allowed such conveniences as scanning, the typical parallel computer will not possess this capability. Instead, one clock is assumed. Accordingly, any scanning would consume multiple clock cycles expanding the operation in proportion with the parallelism factor. Scanning is therefore eschewed.

Instead procedures involving scanning in the previous embodiment, such as AP assignment, can be synthesized with broadcast operations and look-up tables. Specifically, a bit-broadcast operation involves the contribution of one bit to a multiple-bit word by each processing element (PE). The target location within the word is determined by PE ordinality in mutual exclusivity. The bit-broadcast operation incurs no serial dependency because all PEs may deliver their contribution simultaneously.

2.1 Encoding Software

The following pseudo-code fragment will be referred to in the remainder of this discussion:

```
S ← symbol_stream                              [1]
position ← 0                                    [2]
    while data remains                          [3]
        bit_broadcast i, availability           [4]
        receive A                               [5]
        if availability = true                  [6]
            offset ← bit_count(A,i)             [7]
            symbol ← S(position+offset)         [8]
            j = 0                               [9]
        fi                                      [10]
        bit_broadcast_gl(i, encode_bit(symbol,j)) [11]
        j = j + 1                               [12]
        availability ← (encoder_finished() = true) [13]
        position ← position + bit_count(A,p)    [14]
elihw                                           [15]
```

Hereinafter, numbers prefixed in the text by E shall refer to line numbers in the above code.

The symbol data is originally distributed to all PEs in SIMD fashion E1, processing then ensues. To implement AP assignment, each PE broadcasts its availability status in its respective position E4. AP assignment is only undertaken for a particular PE in the current cycle if that PE is indeed available E6, as indicated by its own status contribution. It is the count of the affirmative bits corresponding to preceding PEs in the received status word E5 that determines the offset into the symbol data E7. Thereby, no two PEs are assigned the same symbol, yet the assignment of all symbols is assured. The effect is entirely equivalent to the AP assignment strategy described in the serial-channel embodiment.

Having retrieved the appropriate symbol E9, one bit per loop is encoded and output E11, starting with the first codebit and incrementally proceeding to the last E12. At the end of each loop it is determined whether the codeword has been completely encoded and the availability status is adjusted accordingly E13. Note that a bit broadcast to a global output E11 allows the simultaneous assembly of the intermediate parallel result. Unlike the previous embodiment, this is not linearized explicitly.

Before proceeding to the next iteration, a positional pointer indexing the first potential symbol in an iteration is advanced beyond the last symbol consumed in the present iteration. This requires another affirmative bit count E14, in this circumstance, inclusive of all PEs' availability status.

2.2 Communication Means

Communication between encoding and decoding computations likely includes a detour through storage of some sort. Since all encoded bits may be read and written in global bit broadcasts as words, ordinal and temporal correlation is guaranteed by the underlying word structure of the processor communication network and memory.

2.3 Decoding Software

The following pseudo-code fragment will be referred to in the remainder of this discussion:

```
S ← global_empty_symbol_stream                 [1]
position = 0                                    [2]
while data remains                              [3]
    if decode(next_codebit(),result) = true     [4]
        queue(Q,result)                         [5]
        output ← shift(arrival,1)               [6]
    else                                        [7]
        output ← shift(arrival,0)               [8]
    fi                                          [9]
    bit_broadcast i, output                     [10]
    receive A                                   [11]
    if output = 1                               [12]
        offset ← bit_count(A,i)                 [13]
        S(position + offset) ← dequeue(Q)       [14]
    fi                                          [15]
    position ← position + bit_count(A,p)        [16]
elihw                                           [17]
```

Hereinafter, numbers prefixed in the text by D shall refer to line numbers in the above code.

A codebit positionally corresponding with each PE's ordinality is accepted and applied to further decode a developing result D4. If decoding is complete D4 the result, now guaranteed to be a symbol, is queued D5 and a high value is shifted into an arrival word D6. If decoding requires additional iterations D7 a low value is shifted into an arrival word D8. This arrival word hence delays notice of completion of decoding by several iterations, the quantity of which is equal to the length of the word.

The bit shifted out of the arrival word is bit broadcast in the relative position reserved for the current PE D10. If the current PE is prepared to emit a symbol D12 a count of the bits of the received composite D11 of all PEs' delayed arrival notifications is undertaken considering only the contribution from those PEs which are ordinal predecessors D13. This sum represents the number of PEs prepared to produce output, and thus the number of symbols which precede the present symbol. The symbol is extracted from the queue and placed accordingly D14.

The leftmost position in symbol memory in which S may be placed is updated by counting the affirmative bits of the composite delayed-arrive word and adding these D16. This count advances the positional pointer past all symbols output in the present iteration.

2.4 Operational Highlights

By using slotted broadcast communications such as the bit broadcast, communication time does not grow with parallelism factor, but remains constant. Furthermore, the bit counting can be implemented in a number of ways that do grow more complex with parallelism. For example, some processors may offer a native prefix-sum operation, another name for the bit-counting task. Where it is not provided, the operation may be synthesized with a simple look-up table. It is understood that a look-up table containing pre-computed values can return a result in constant time regardless of the parallelism factor. As far as output of symbols, if a word-level slotted broadcast mechanisms exist, S can be made global as shown here. If not, data merging operations may be available as a post-processing step. This is computer dependent, but some data consolidation usually exists in parallel computing environments. Thus, as in this embodiment, it should be possible to write constant-time coding embodiments for general SIMD computers 3. Other Embodiments The preferred embodiments provided herein are meant to serve only as examples. Other embodiments possessing the claimed features are easily devised using alternative channel sharing techniques and/or more involved functional assignment strategies.

What is claimed:

1. A machine for concurrently processing digital variable-length codes comprising:
    (a) a plurality of variable-length encoding processors,
    (b) a plurality of variable-length decoding processors,
    (c) a communicator transferring output of said encoding processors to said decoding processors, which will:
        (1) maintain ordinal correspondence between said encoding processors and said decoding processors, and
        (2) maintain temporal correspondence among said decoding processors relating to the temporal correspondence among encoding processors,
    (d) a controller regulating encoding which will assign data to said encoding processors according to a timed relation based on:
        (1) said encoding processors' ordinal rank, and
        (2) said encoding processors' processing status,
    (e) a controller regulating decoding which will:
        (1) temporally align resultant data from said decoding processors with regard to antecedent input
        (2) output data resultant from said decoding processors according to a timed relation based on:
            (i) said decoding processors' ordinal rank, and
            (ii) said decoding processors' processing status,
    whereby a plurality of variable-length data elements may be acted upon simultaneously, and
    whereby no restriction is placed on the independence of input data.

2. The machine of claim 1 wherein said communicator comprises:
    (a) a time-division multiplexor,
    (b) a serial channel, and
    (c) a time-division demultiplexor.

3. The machine of claim 1 wherein
    (a) said timed relation on said controller regulating encoding will identify from among said encoding processors one which:
        (1) is of lowest ordinal rank, and
        (2) is available,
    (b) said timed relation on said controller regulating decoding will identify from among said encoding processors one which:
        (1) is of lowest ordinal rank,
        (2) possesses pending output, and
        (3) received antecedent input of said pending output at a predetermined prior time.

4. The machine of claim 3 wherein said communicator comprises:
    (a) a time-division multiplexor,
    (b) a serial channel, and
    (c) a time-division demultiplexor.

5. The machine of claim 1 wherein
    (a) said timed relation on said controller regulating encoding will identify from among said encoding processors one which:
        (1) is of highest ordinal rank, and
        (2) is available,
    (b) said timed relation on said controller regulating encoding will identify from among said encoding processors one which:
        (1) is of highest ordinal rank,
        (2) possesses pending output, and
        (3) received antecedent input of said pending output input at a predetermined prior time.

6. The machine of claim 5 wherein said communicator comprises:
    (d) a time-division multiplexor,
    (e) a serial channel, and
    (f) a time-division demultiplexor.

7. The machine of claim 1 wherein said controller regulating decoding uses a plurality of memories to temporally align resultant data from said decoding processors with regard to said antecedent input.

8. The machine of claim 7 wherein each memory from said plurality of memories comprises:
    (a) a queue, and
    (b) a shift register.

9. A method for processing digital variable-length code concurrently comprising
    (a) processing a plurality of variable-length encoding tasks,
    (b) processing a plurality of variable-length decoding tasks,
    (c) communicating output from said encoding tasks to said decoding tasks such that
        (1) ordinal correspondence is maintained between said encoding tasks and said decoding tasks, and
        (2) temporal correspondence is maintained among said decoding tasks in a way that relates to the temporal correspondence among said encoding tasks,
    (d) regulating the assignment of data to said encoding tasks by:
        (1) ordinal rank of said encoding tasks, and
        (2) processing status of said encoding tasks,
    (e) regulating the output of data resultant from said decoding tasks by:

(1) ordinal rank of said encoding tasks,
(2) processing status of said decoding tasks, and
(3) elapsed delay with respect to antecedent inputs of said decoding tasks, whereby a plurality of variable-length data elements may be processed simultaneously, and whereby no restriction is placed on the independence of input data.

10. The method of claim 9 wherein communicating said output is accomplished by:
   (a) serializing with time-division multiplexing,
   (b) transmitting over a serial channel, and
   (c) deserializing with time-division demultiplexing.

11. The method of claim 10 wherein
   (a) regulating said assignment of data to said encoding tasks is accomplished by choosing for assignment one of said encoding tasks with:
      (1) lowest ordinal rank, and
      (2) availability,
   (b) regulating the said output of data resultant from said decoding tasks is accomplished by choosing one of said decoding tasks with:
      (1) lowest ordinal rank,
      (2) pending output, and
      (3) antecedent input of said pending output occurring, at a predetermined previous time.

12. The method of claim 9 wherein
   (a) regulating said assignment of data to said encoding tasks is accomplished by choosing for assignment one of said encoding tasks with:
      (1) lowest ordinal rank, and
      (2) availability,
   (b) regulating the said output of data resultant from said decoding tasks is accomplished by choosing one of said decoding tasks with:
      (1) lowest ordinal rank,
      (2) pending output, and
      (3) antecedent input of said pending output occurring at a predetermined previous time.

13. The method of claim 9 wherein said predetermined elapsed delay is provided by retaining outputs from said decoding tasks in a plurality of retainers.

14. The method of claim 10 wherein said predetermined elapsed delay is provided by retaining outputs from said decoding tasks in a plurality of retainers.

15. The method of claim 9 wherein processing occurs on a SIMD parallel computer.

16. The method of claim 15 wherein regulating assignment is accomplished with the aid of lookup tables and broadcast operations.

17. The method of claim 9 wherein communicating is accomplished with intermediate storage.

18. A machine for concurrently processing digital variable-length codes comprising:
   (a) a plurality of variable-length encoding processors,
   (b) a plurality of variable-length decoding processors,
   (c) a communication means transferring output of said encoding processors to said decoding processors, which will:
      (3) maintain ordinal correspondence between said encoding processors and said decoding processors, and
      (4) maintain temporal correspondence among said decoding processors relating to the temporal correspondence among encoding processors,
   (d) a controlling means which will:
      (1) assign data to said encoding processors according to:
         (i) said encoding processors' ordinal rank, and
         (ii) said encoding processors' processing status,
      (2) output data resultant from said decoding processors according to:
         (i) said decoding processors' ordinal rank,
         (ii) said decoding processors' processing status,
      (3) provide for temporal correlation between input of said decoding processors and output of said machine.

whereby a plurality of variable-length data elements may be acted upon simultaneously, and whereby no restriction is placed on the independence of input data.

19. The machine of claim 17 wherein said communication means comprises time-division multiplexing over a serial channel.

* * * * *